US009711360B2

(12) United States Patent
Duan et al.

(10) Patent No.: US 9,711,360 B2
(45) Date of Patent: Jul. 18, 2017

(54) METHODS TO IMPROVE IN-FILM PARTICLE PERFORMANCE OF AMORPHOUS BORON-CARBON HARDMASK PROCESS IN PECVD SYSTEM

(71) Applicant: Applied Materials, Inc., Santa Clara, CA (US)

(72) Inventors: Ziqing Duan, Sunnyvale, CA (US); Kwangduk Douglas Lee, Redwood City, CA (US); Abdul Aziz Khaja, San Jose, CA (US); Amit Kumar Bansal, Milpitas, CA (US); Bok Hoen Kim, San Jose, CA (US); Prashant Kumar Kulshreshtha, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/203,032

(22) Filed: Jul. 6, 2016

(65) Prior Publication Data
US 2017/0062218 A1    Mar. 2, 2017

Related U.S. Application Data

(60) Provisional application No. 62/210,681, filed on Aug. 27, 2015.

(51) Int. Cl.
*H01L 21/033* (2006.01)
*C23C 16/505* (2006.01)
*C23C 16/455* (2006.01)

(52) U.S. Cl.
CPC ........ *H01L 21/0338* (2013.01); *C23C 16/455* (2013.01); *C23C 16/505* (2013.01);
(Continued)

(58) Field of Classification Search
None
See application file for complete search history.

(56) References Cited

U.S. PATENT DOCUMENTS 6,573,030 B1    6/2003   Fairbairn et al.
8,536,065 B2    9/2013   Seamons et al.
(Continued)

FOREIGN PATENT DOCUMENTS

KR    10-2013-0041120 A    4/2013

OTHER PUBLICATIONS

International Search Report and Written Opinion for International Application No. PCT/US2016/041560 (APPM/023273PCT) dated Oct. 14, 2016.

*Primary Examiner* — Angel Roman
(74) *Attorney, Agent, or Firm* — Patterson + Sheridan, LLP

(57) ABSTRACT

Implementations of the present disclosure generally relate to the fabrication of integrated circuits. More particularly, the implementations described herein provide techniques for deposition of boron-containing amorphous carbon films on a substrate with reduced particle contamination. In one implementation, the method comprises flowing a hydrocarbon-containing gas mixture into a processing volume having a substrate positioned therein, flowing a boron-containing gas mixture into the processing volume, stabilizing the pressure in the processing volume for a predefined RF-on delay time period, generating an RF plasma in the processing volume after the predefined RF-on delay time period expires to deposit a boron-containing amorphous film on the substrate, exposing the processing volume of the process chamber to a dry cleaning process and depositing an amorphous boron season layer over at least one surface in the processing volume of the process chamber.

20 Claims, 10 Drawing Sheets

(52) U.S. Cl.
CPC ...... *H01L 21/0332* (2013.01); *H01L 21/0335* (2013.01); *H01L 21/0337* (2013.01)

(56) References Cited

U.S. PATENT DOCUMENTS

| | | |
|---|---|---|
| 2009/0233385 A1* | 9/2009 | Okumura .............. C23C 14/564 438/16 |
| 2010/0075489 A1* | 3/2010 | Sasaki ................. H01L 21/2236 438/513 |
| 2010/0112822 A1* | 5/2010 | Toratani .............. C23C 16/0272 438/758 |
| 2011/0151142 A1 | 6/2011 | Seamons et al. |
| 2014/0017897 A1 | 1/2014 | Seamons et al. |
| 2014/0206097 A1 | 7/2014 | Jeong et al. |
| 2014/0213059 A1 | 7/2014 | Doan et al. |
| 2014/0213062 A1 | 7/2014 | Shimizu et al. |
| 2014/0216498 A1 | 8/2014 | Lee et al. |
| 2014/0272184 A1 | 9/2014 | Sreekala et al. |

\* cited by examiner

METHODS TO IMPROVE IN-FILM PARTICLE PERFORMANCE OF AMORPHOUS BORON-CARBON HARDMASK PROCESS IN PECVD SYSTEM

CROSS-REFERENCE TO RELATED APPLICATIONS

This application claims benefit of U.S. provisional patent application Ser. No. 62/210,681, filed Aug. 27, 2015. The aforementioned related patent application is herein incorporated by reference in its entirety.

BACKGROUND

Field

Implementations of the present disclosure generally relate to the fabrication of integrated circuits. More particularly, the implementations described herein provide techniques for deposition of boron-containing amorphous carbon films on a substrate with reduced particle contamination.

Description of the Related Art

One of the primary processes in the fabrication of modern semiconductor devices is the formation of a thin film on a semiconductor substrate by chemical reaction of gases. Such a deposition process is referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having metal layers previously formed thereon.

Processes that have been developed to deposit mask materials at relatively low temperatures include plasma-enhanced CVD (PECVD) techniques. Plasma-enhanced CVD techniques promote excitation and/or disassociation of the reactant gases by the application of radio frequency (RF) energy to a reaction zone near the substrate surface, thus creating plasma of highly reactive species. The high reactivity of the released species reduces the energy required for a chemical reaction to take place, and thus lowers the required temperature for such PECVD processes.

The surface upon which a CVD layer is deposited may contain sorbable contaminants such as fluorine deposits from chamber cleaning and dopants from other processes. The presence of fluorine or other sorbable contaminants, for example, boron, may affect the absorption of precursors and slow or inhibit the deposition rate of the CVD layer. Fluorine in the chamber can also form particles when contacted by the reactive gases used to deposit a PECVD layer.

Particle contamination within the chamber is typically controlled by periodically cleaning the chamber using cleaning gases, typically fluorinated compounds, which are excited to inductively or capacitively coupled plasmas. Cleaning gases are selected based on their ability to bind the precursor gases and the deposition material, which has formed on the chamber components, in order to form stable volatile products, which can be exhausted from the chamber, thus cleaning the process environment.

Once the chamber has been sufficiently cleaned of the process gases and the cleaning by-products have been exhausted out of the chamber, a season process is performed to deposit a film onto components of the chamber forming the processing volume to seal remaining contaminants therein and reduce the contamination level during processing. This process is typically carried out by depositing a season film to coat the interior surfaces forming the processing volume of the chamber.

While chamber cleaning and deposition of a season film have been successful in reducing most contaminants in a plasma reactor, sorbable contaminants such as fluorine and boron have still been measured above desired levels. Therefore, there exists a need for methods for further reducing sorbable contaminants within a plasma reactor.

SUMMARY

Implementations of the present disclosure generally relate to the fabrication of integrated circuits. More particularly, the implementations described herein provide techniques for deposition of boron-containing amorphous carbon films on a substrate with reduced particle contamination. In one implementation, a method of processing a substrate in a process chamber is provided. The method comprises flowing a hydrocarbon-containing gas mixture into a processing volume having a substrate positioned therein, flowing a boron-containing gas mixture into the processing volume, stabilizing the pressure in the processing volume for a predefined RF-on delay time period, generating an RF plasma in the processing volume after the predefined RF-on delay time period expires to deposit a boron-containing amorphous film on the substrate, exposing the processing volume of the process chamber to a dry cleaning process and depositing an amorphous boron season layer over at least one surface in the processing volume of the process chamber.

In another implementation, a method of processing a substrate in a process chamber is provided. The method comprises flowing a hydrocarbon-containing gas mixture into a processing volume having a substrate positioned therein, flowing a boron-containing gas mixture into the processing volume, stabilizing the pressure in the processing volume for a predefined RF-on delay time period and generating an RF plasma in the processing volume after the predefined RF-on delay time period expires to deposit a boron-containing amorphous film on the substrate.

In yet another implementation, a method of cleaning a process chamber is provided. The method comprises exposing a processing volume of a process chamber to a dry cleaning process and depositing an amorphous boron season layer over at least one surface in the processing volume of the process chamber.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
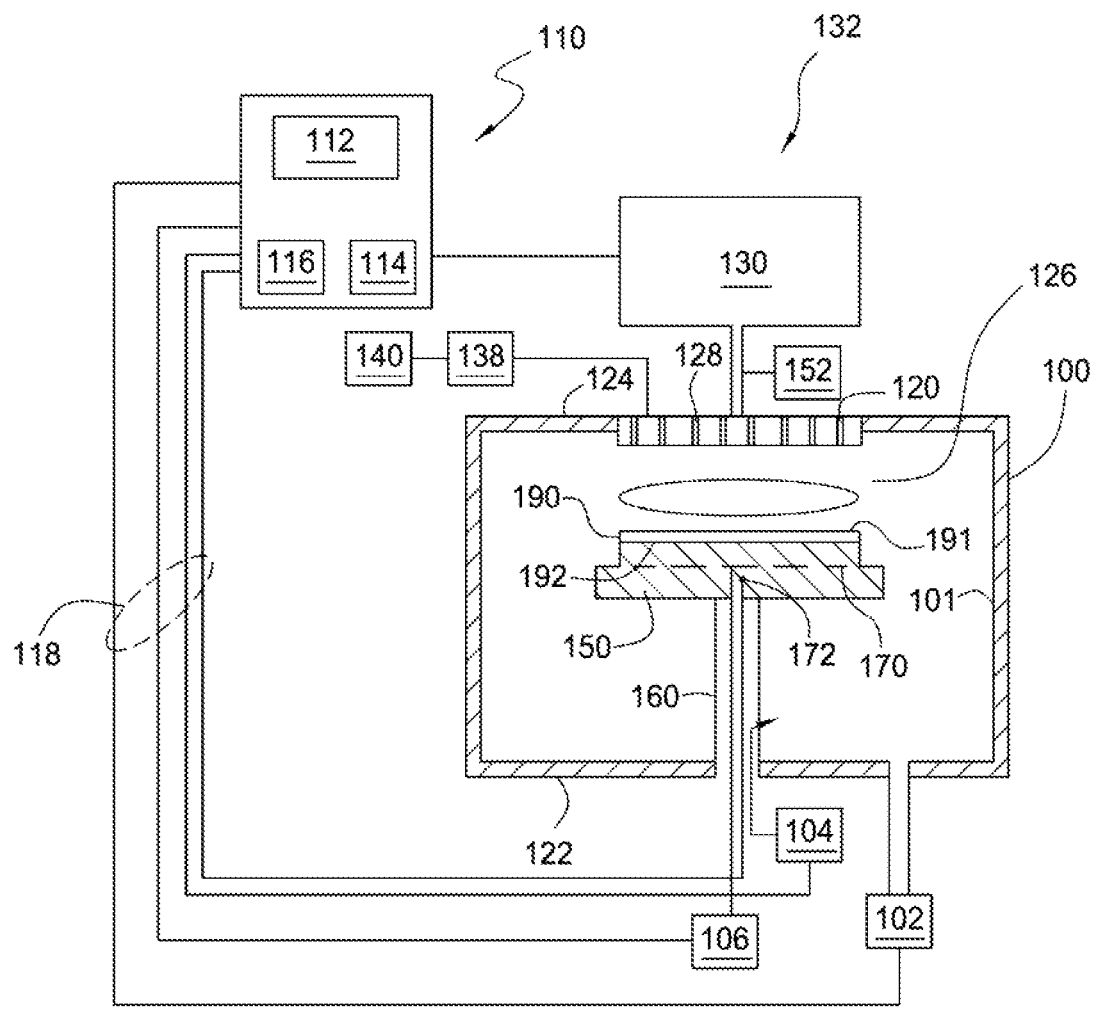
FIG. 1 depicts a schematic illustration of an apparatus that can be used for the practice of implementations described herein.

To facilitate understanding, identical reference numerals have been used, where possible, to designate identical elements that are common to the figures. It is contemplated that elements and features of one implementation may be beneficially incorporated in other implementations without further recitation. It is to be noted, however, that the appended drawings illustrate only exemplary implementations of this disclosure and are therefore not to be considered limiting of its scope, for the disclosure may admit to other equally effective implementations.

DETAILED DESCRIPTION

The following disclosure describes techniques for deposition of boron-containing amorphous carbon films on a substrate with reduced particle contamination. Certain details are set forth in the following description and in FIGS. 1-10 to provide a thorough understanding of various implementations of the disclosure. Other details describing well-known structures and systems often associated with boron-containing amorphous carbon films and season layers are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a PECVD process that can be carried out using any suitable thin film deposition system. Examples of suitable systems include the CENTURA® systems which may use a DxZ™ processing chamber, PRECISION 5000® systems, PRODUCER™ systems, PRODUCER GT™ and the PRODUCER SE™ processing chambers which are commercially available from Applied Materials, Inc., of Santa Clara, Calif. Other tools capable of performing PECVD processes may also be adapted to benefit from the implementations described herein. In addition, any system enabling the PECVD processes described herein can be used to advantage. The apparatus description described herein is illustrative and should not be construed or interpreted as limiting the scope of the implementations described herein.

Advanced patterning film (APF) is a family of specialized strippable amorphous carbon films developed through PECVD for 3×nm nodes and below hardmask applications. Recently, a new class of etching hardmask films (e.g., boron-containing amorphous carbon film) has been demonstrated for supporting high aspect ratio patterning requested by further DRAM and NAND scaling. This boron-containing amorphous carbon film provides ultra-high etch selectivity (over two times the etch selectivity of un-doped carbon hardmask), relatively high transparency (low extinction coefficient $k<0.1@$ 633 nm), enhanced pattern-transferring accuracy during photolithography processes and improved patterning of more complex device structure at smaller technology nodes.

With the development of integrated circuits, the feature size of circuits is becoming smaller and smaller and integration density of electronic components keeps increasing. As a result, the requirement for particles or defects caused by processing, a common source of detrimental damages to the overall devices, becomes tighter and tighter. It is especially desirable to limit the number of in-film particles in boron-containing amorphous carbon films as small as possible, e.g. <20, for the specific sizes (e.g. >0.09 µm).

Boron-containing amorphous carbon film may be deposited using PECVD techniques. Usually, a complete single run of this process includes a deposition process and a clean process. During deposition, substrates are provided in a vacuum processing chamber where a hydrocarbon and boron-containing gas mixture is flowed in the presence of plasma. After deposition, a "dry clean" process is implemented to remove the residues deposited on the chamber wall and other parts of the chamber (e.g., showerhead, heater, liners, etc.). There are two main purposes for this cleaning process: avoiding contamination particles caused by the deposition residues and maintaining a repeated clean chamber environment for every single run of deposition.

In general, in-film particles are formed during deposition, caused by the cleaning process, or both. For boron-containing amorphous carbon film deposition, two precursors are mixed and reacted on the substrate. Gas-phase reaction is usually avoided to reduce in-film particles. However, the non-stability of the boron precursor, e.g., diborane, appears to be a concern, which could be thermally decomposed to form boron and becomes an in-film particle source. During APF deposition, precursor gases and diluted gases are flowed to the chamber together for stabilization and mixture before the plasma is turned on, which gives stable RF plasma at the beginning and thus less in-film particles. However, for boron-containing amorphous carbon film deposition, stabilization of the precursor gases in the chamber before igniting RF plasma leads to thermal decomposition of boron resulting in in-film particles.

One previous solution was to stabilize the boron precursor gas flow in a diverter line prior to flowing the boron precursor gas into the processing volume. However, when the boron precursor gas "flow to divert" is switched to "flow to chamber" at the RF-on process, unexpected dirty particles are back-streamed from the foreline to the chamber, causing in-film particles adders. Therefore, it is preferable to flow the boron precursor gas directly to the chamber when the "real" deposition starts. However, if the boron precursor gas flows directly to the chamber at the "real" deposition process, the RF plasma will not turn on until the chamber pressure becomes stable. This time delay between boron gas flowing to the chamber and the plasma turning-on is variable for each process run, which causes non-repeatability issues for the process.

In the present disclosure, methods for flowing the boron precursor directly to the chamber at the plasma-on process are provided. In one implementation, a fixed time delay, e.g. 0.1-5 seconds, is applied, and a pressure band, e.g. 0.05-0.5 Torr, is set-up. If the pressure variation due to the injection of boron-containing precursor gas is less than the pressure band in the fixed delay time, the RF plasma will be turned on and "real" deposition will start. Thus, the goals of good repeatability of the process and good in-film particle performance are achieved.

The "dry clean" process for boron-containing amorphous carbon films typically utilizes a remote plasma system for delivering high concentrations of reactive gas species to etch deposition residues on the chamber components. In this process, undesirable mobile ions and metal contaminants are driven out of the reaction chamber components causing in-film particles. A season layer is typically used to cover chamber components and minimize formation of undesirable contaminants. Typically, the season layer is deposited using the same or similar gas mixtures to the gas mixture used in the deposition process because the identical components of season layer will not contaminate the deposition layer. Another consideration is the adhesion of the season layer to chamber components materials (e.g. aluminum or aluminum oxide materials). Poor adhesion of season layers to chamber components can lead to fallen particles in the deposition process.

In the present disclosure, an amorphous boron layer is used as a season layer for better control of in-film particles. In one implementation, the amorphous born layer is deposited by thermal decomposition of a boron-containing precursor. In one implementation, the amorphous boron layer has a thickness from about 100 Å to about 2000 Å. Compared with amorphous carbon and amorphous boron-carbon season layers currently used, the amorphous boron season layer described herein provides improved adhesion to the surface of the chamber components and as a result, fewer in-film particles (<30 adders for particle size >0.09 μm).

FIG. 1 depicts a schematic illustration of a substrate processing system 132 that can be used to perform amorphous carbon layer deposition in accordance with implementations described herein. The substrate processing system 132 includes a process chamber 100 coupled to a gas panel 130 and a controller 110. The process chamber 100 generally includes a top wall 124, a sidewall 101 and a bottom wall 122 that define a processing volume 126. A support pedestal 150 is provided in the processing volume 126 of the process chamber 100. The support pedestal 150 is supported by a stem 160 and may be typically fabricated from aluminum, ceramic, and other suitable materials. The support pedestal 150 may be moved in a vertical direction inside the process chamber 100 using a displacement mechanism (not shown).

The support pedestal 150 may include a heater element 170 suitable for controlling the temperature of a substrate 190 supported on a surface 192 of the support pedestal 150. In one implementation, the heater element 170 is embedded in the support pedestal 150. The support pedestal 150 may be resistively heated by applying an electric current from a power supply 106 to the heater element 170. The heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thus maintaining the substrate 190 and the support pedestal 150 at a substantially constant temperature during film deposition. The supplied electric current may be adjusted to selectively control the temperature of the support pedestal 150 between about 100 degrees Celsius to about 700 degrees Celsius.

A temperature sensor 172, such as a thermocouple, may be embedded in the support pedestal 150 to monitor the temperature of the support pedestal 150 in a conventional manner. The measured temperature is used by the controller 110 to control the power supplied to the heater element 170 to maintain the substrate at a desired temperature.

A vacuum pump 102 is coupled to a port formed in the bottom of the process chamber 100. The vacuum pump 102 is used to maintain a desired gas pressure in the process chamber 100. The vacuum pump 102 also evacuates post-processing gases and by-products of the process from the process chamber 100.

The substrate processing system 132 may further include additional equipment for controlling the chamber pressure, for example, valves (e.g. throttle valves and isolation valves) positioned between the process chamber 100 and the vacuum pump 102 to control the chamber pressure.

The substrate processing system 132 may further include a purge gas source 104 for supplying a purge gas to the processing volume 126.

A showerhead 120 having a plurality of apertures 128 is disposed on the top of the process chamber 100 above the support pedestal 150. The apertures 128 of the showerhead 120 are utilized to introduce process gases into the process chamber 100. The apertures 128 may have different sizes, number, distributions, shape, design, and diameters to facilitate the flow of the various process gases for different process requirements. The showerhead 120 is connected to the gas panel 130 that allows various gases to supply to the processing volume 126 during process. Plasma is formed from the process gas mixture exiting the showerhead 120 to enhance thermal decomposition of the process gases resulting in the deposition of material on a surface 191 of the substrate 190.

The showerhead 120 and the support pedestal 150 may form a pair of spaced apart electrodes in the processing volume 126. One or more RF power sources 140 provide a bias potential through a matching network 138 to the showerhead 120 to facilitate generation of plasma between the showerhead 120 and the support pedestal 150. Alternatively, the RF power sources 140 and matching network 138 may be coupled to the showerhead 120, support pedestal 150, or coupled to both the showerhead 120 and the support pedestal 150, or coupled to an antenna (not shown) disposed exterior to the process chamber 100. In one implementation, the RF power sources 140 may provide between about 100 Watts and about 3,000 Watts at a frequency of about 50 kHz to about 13.6 MHz. In another implementation, the RF power sources 140 may provide between about 500 Watts and about 1,800 Watts at a frequency of about 50 kHz to about 13.6 MHz. Alternatively, plasma may be supplied to the processing volume 126 via a remote plasma source 152.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the substrate processing system 132 are handled through numerous signal cables collectively referred to as signal buses 118, some of which are illustrated in FIG. 1.

Other deposition chambers may also benefit from the present disclosure and the parameters listed above may vary according to the particular deposition chamber used to form the amorphous carbon layer. For example, other deposition chambers may have a larger or smaller volume, requiring gas flow rates that are larger or smaller than those recited for deposition chambers available from Applied Materials, Inc. In one implementation, the boron-containing amorphous carbon layer may be deposited using a PRODUCER SE™ or PRODUCER GT™ processing chamber, which is commercially available from Applied Materials, Inc., Santa Clara, Calif. using the parameters set forth in Table I below.

The quantity/percentage of boron in the as-deposited boron-containing amorphous carbon film may vary from application to application. In various implementations of the present disclosure, the boron-containing amorphous carbon film may contain at least 8, 10, 15, 20, 25, 30, 35, 40, 45, 50, 55, 60 or 65 atomic percentage of boron. The boron-containing amorphous carbon film may contain up to 15, 20, 25, 30, 35, 40, 45, 50, 55, 60, 65 or 70 atomic percentage of boron. The boron-containing amorphous carbon film may contain from about 10 to about 70 atomic percentage of boron. The boron-containing amorphous carbon film may contain from about 30 to about 60 atomic percentage of boron.

The boron-containing amorphous carbon film may contain at least 15, 20, 25, 30, 35, 40, 45, 50, 55, or 60 atomic percentage of carbon. The boron-containing amorphous carbon film may contain up to 25, 30, 35, 40, 45, 50, 55, 60, or 65 atomic percentage of carbon. The boron-containing amorphous carbon film may contain from about 20 to about 65 atomic percentage of carbon, for example about 35 to about 50 atomic percentage of carbon.

The boron-containing amorphous carbon film may contain at least 10, 15, 20, 25, 30, or 35 atomic percentage of hydrogen. The boron-containing amorphous carbon film may contain up to 15, 20, 25, 30, or 40 atomic percentage of hydrogen. The boron-containing amorphous carbon film may contain from about 10 to about 25 atomic percentage of hydrogen.

In certain implementations where nitrogen is used as a precursor, the boron-containing amorphous carbon film may contain at least 5, 10, or 15 atomic percentage of nitrogen. The boron-containing amorphous carbon film may contain up to 10, 15, or 20 atomic percentage of nitrogen.

In general, the following exemplary deposition process parameters may be used to form the boron-containing amorphous carbon layer. The process parameters may range from a wafer temperature of about 100 degrees Celsius to about 700 degrees Celsius (e.g., between about 200 degrees Celsius to about 500 degrees Celsius; between about 300 degrees Celsius to about 400 degrees Celsius). The chamber pressure may range from a chamber pressure of about 1 Torr to about 20 Torr (e.g., between about 2 Torr and about 10 Torr; between about 5 Torr and about 6 Torr). The flow rate of the hydrocarbon-containing gas may be from about 200 sccm to about 5,000 sccm (e.g., between about 400 sccm and about 2,000 sccm; between about 500 sccm and about 700 sccm). The flow rate of a dilution gas may individually range from about 0 sccm to about 20,000 sccm (from about 2,000 sccm to about 10,000 sccm; from about 5,000 sccm to about 7,000 sccm). The flow rate of an inert gas may individually range from about 0 sccm to about 20,000 sccm (e.g., from about 200 sccm to about 2,000 sccm; from about 400 sccm to about 500 sccm). The flow rate of the boron-containing gas mixture may be from about 0 sccm to about 15,000 sccm (e.g., between about 1,000 sccm and about 10,000 sccm; between about 2,000 sccm and about 6,000 sccm; between about 4,000 sccm and about 5,000 sccm).

The RF power may be between about 1 W/in$^2$ and about 100 W/in$^2$ (e.g., between about 3 W/in$^2$ and about 20 W/in$^2$. The plate spacing between the top surface of the substrate and the showerhead may be between about 200 mils to about 600 mils. The boron-containing amorphous carbon layer may be deposited to a thickness between about 100 Å and about 20,000 Å, such as between about 300 Å to about 5000 Å. The above process parameters provide a typical deposition rate for the boron-containing amorphous carbon layer in the range of about 100 Å/min to about 10,000 Å/min and can be implemented on a 300 mm substrate in a deposition chamber available from Applied Materials, Inc. of Santa Clara, Calif.

TABLE I

| Deposition Parameter | Exemplary Range | |
| --- | --- | --- |
| Temperature (° C.) | 100-700° C. | 400° C. |
| Pressure (Torr) | 1-20.0 Torr | 7.0 Torr |
| RF Power (13.56 MHz) | 100-3,000 Watts | 1,200 Watts |
| Spacing | 200-600 mils | 320 mils |
| C$_3$H$_6$ flow | 200-5,000 sccm | 500 sccm |
| He flow | 0-10,000 sccm | 400 sccm |
| B$_2$H$_6$ mixture flow | 0-15,000 sccm | 4,000 sccm |
| Ar flow | 0-10,000 sccm | 7,000 sccm |

The as-deposited boron-containing amorphous carbon film may have uniformity (R/2%) of less than 2.0%. The as-deposited boron-containing amorphous carbon film may have a refractive index (RI (633 nm)) of greater than 1.8, for example approximately 2.32. The as-deposited boron-containing amorphous carbon film may have a k value (K (at 633 nm)) of less than 0.1, for example, approximately 0.02. The as-deposited boron-containing amorphous carbon film may have a stress (MPa) of from about 0 to about −500 MPa, for example −50 MPa. The as-deposited boron-containing amorphous carbon film may have a density (g/cc) of greater than 1.5 g/cc, for example approximately 1.86 g/cc or higher such as 1.95 g/cc.

Figure 2A:
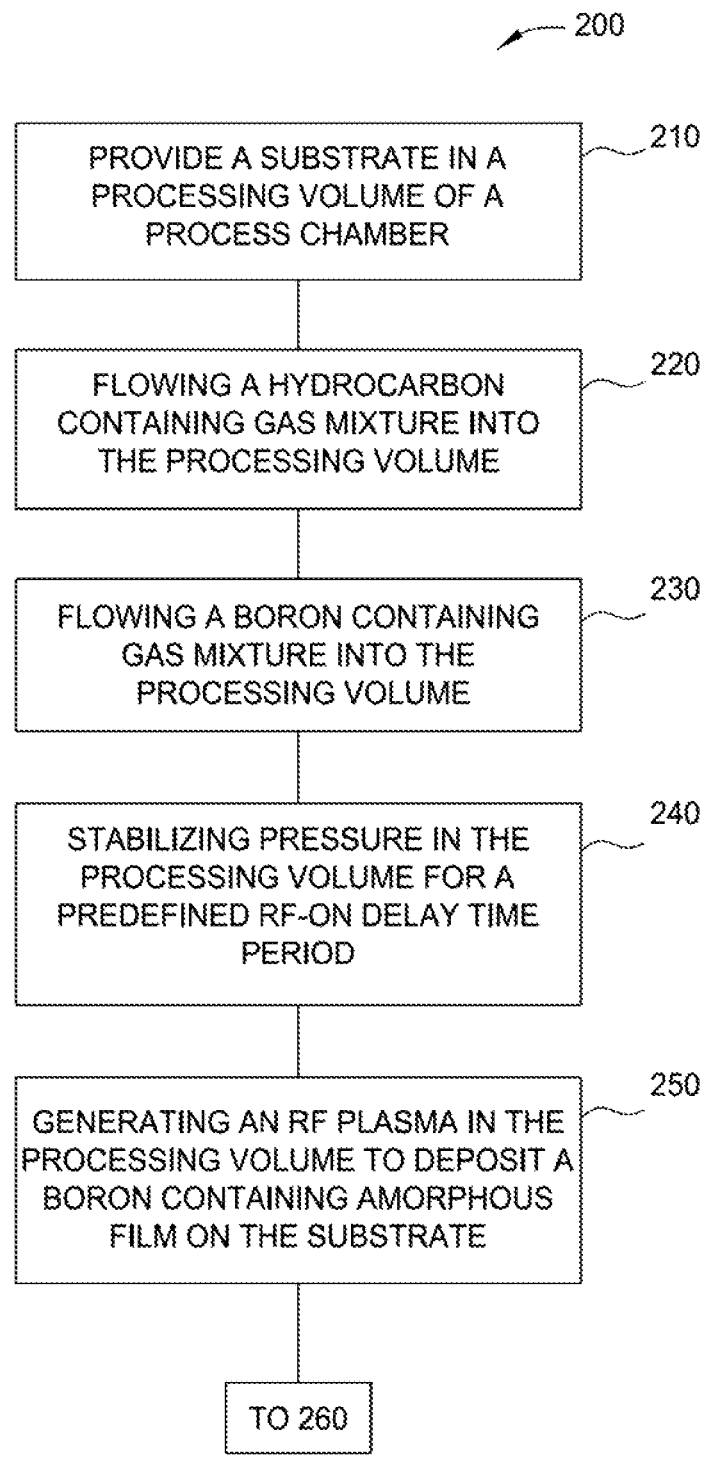
FIGS. 2A-2B depict a process flow diagram depicting one implementation of a method for depositing a boron-containing amorphous carbon film according to implementations described herein.
Figure 2B:
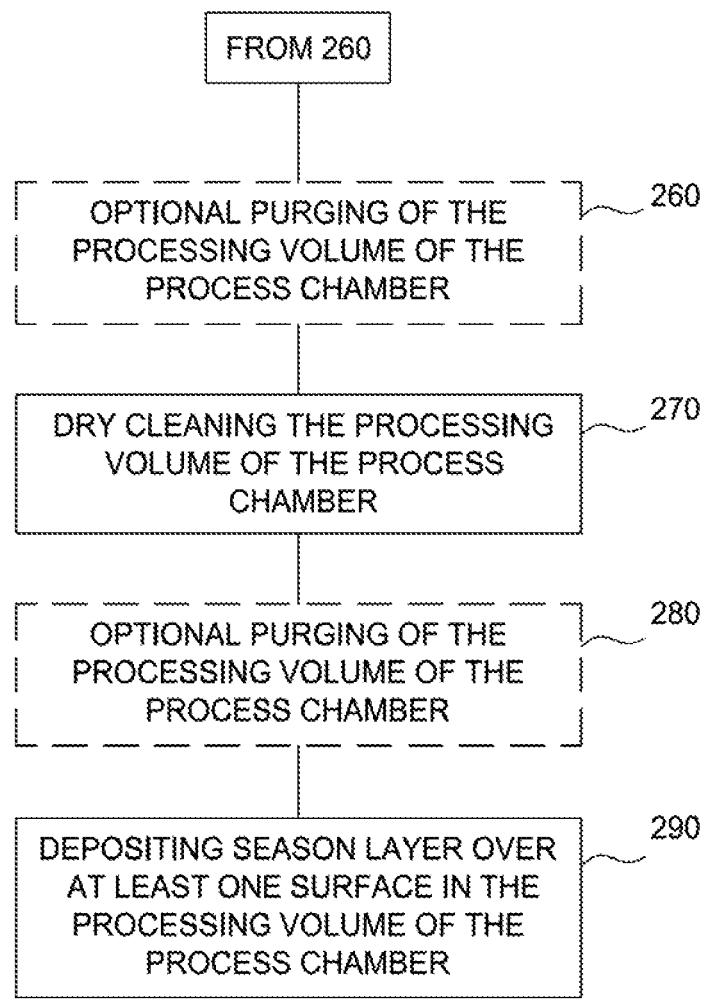
Figure 3:
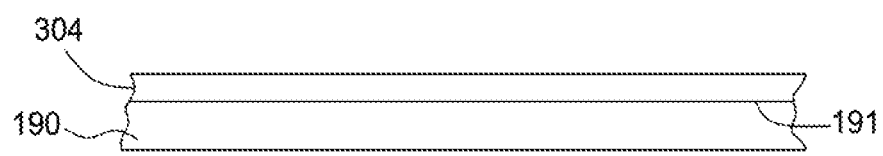
FIG. 3 depicts a schematic cross-sectional view of a substrate structure incorporating a boron-containing amorphous carbon layer as a hardmask layer according to implementations described herein.

FIGS. 2A-2B depict a process flow diagram depicting one implementation of a method 200 for depositing a boron-containing amorphous carbon film according to implementations described herein. The method 200 begins at operation 210 by providing a substrate in a processing volume of a process chamber. The process chamber may be the process chamber 100 depicted in FIG. 1. In one implementation, as shown in FIG. 3, the surface 191 of the substrate 190 is substantially planar. Alternatively, the substrate 190 may have patterned structures, a surface having trenches, holes, or vias formed therein. The substrate 190 may also have a substantially planar surface having a structure formed thereon or therein at a desired elevation. While the substrate 190 is illustrated as a single body, it is understood that the substrate 190 may contain one or more materials used in forming semiconductor devices such as metal contacts, trench isolations, gates, bitlines, or any other interconnect features. The substrate 190 may comprise one or more metal layers, one or more dielectric materials, semiconductor material, and combinations thereof utilized to fabricate semiconductor devices. For example, the substrate 190 may include an oxide material, a nitride material, a polysilicon material, or the like, depending upon application.

In one implementation where a memory application is desired, the substrate 190 may include the silicon substrate material, an oxide material, and a nitride material, with or without polysilicon sandwiched in between. In another implementation, the substrate 190 may include a plurality of alternating oxide and nitride materials (i.e., oxide-nitride-oxide (ONO)) deposited on a surface of the substrate (not shown). In various implementations, the substrate 190 may include a plurality of alternating oxide and nitride materials, one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or undoped amorphous silicon alternating with doped amorphous silicon.

The substrate may be any substrate or material surface upon which film processing is performed. For example, the substrate 190 may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof.

At operation 220, a hydrocarbon-containing gas mixture is flowed into the processing volume 126. The hydrocarbon-containing gas mixture may be flowed from the gas panel 130 into the processing volume 126 through the showerhead 120. The gas mixture may include at least one hydrocarbon compound. The gas mixture may further include an inert gas, a dilution gas, or both. The hydrocarbon can be any liquid or gas, though the preferred precursor would be vapor at room temperature to simplify the hardware for material metering, control and delivery to the chamber.

In one implementation, the carbon source is a gaseous hydrocarbon, such as a linear hydrocarbon. In one implementation, the hydrocarbon compound has a general formula $C_xH_y$, where x has a range of between 1 and 20 and y has a range of between 1 and 20. In one implementation, the hydrocarbon compound is an alkane. Suitable hydrocarbon compounds include, for example, alkanes such as methane ($CH_4$), ethane ($C_2H_6$), propylene ($C_3H_6$), propane ($C_3H_8$), butane ($C_4H_{10}$) and its isomer isobutane, pentane ($C_5H_{12}$) and its isomers isopentane and neopentane, hexane ($C_6H_{14}$) and its isomers 2-methylpentane, 3-methylpentane, 2,3-dimethylbutane, and 2,2-dimethylbutane, or combinations thereof. Additional suitable hydrocarbons include, for example, alkenes such as ethylene, propylene, butylene and its isomers, pentene and its isomers, and the like, dienes such as butadiene, isoprene, pentadiene, hexadiene, or combinations thereof. Additional suitable hydrocarbons include, for example, halogenated alkenes such as monofluoroethylene, difluoroethylene, trifluoroethylene, tetrafluoroethylene, monochloroethylene, dichloroethylenes, trichloroethylene, tetrachloroethylene, or combinations thereof. Additional suitable hydrocarbons include, for example, alkynes such as acetylene ($C_2H_2$), propyne ($C_3H_4$), butylene ($C_4H_8$), vinylacetylene, or combinations thereof. Additional suitable hydrocarbons include, for example, aromatic hydrocarbons, such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene, or combinations thereof. In one example, $C_3H_6$ is preferable due to formation of more stable intermediate species, which allows more surface mobility.

Suitable dilution gases such as helium (He), argon (Ar), hydrogen ($H_2$), nitrogen ($N_2$), ammonia ($NH_3$), or combinations thereof, among others, may be added to the gas mixture, if desired. Ar, He, and $N_2$ are used to control the density and deposition rate of the amorphous carbon layer. In some cases, the addition of $N_2$ and/or $NH_3$ can be used to control the hydrogen ratio of the amorphous carbon layer, as discussed below. Alternatively, dilution gases may not be used during the deposition.

An inert gas, such as argon (Ar) and/or helium (He) may be supplied with the hydrocarbon-containing gas mixture into the process chamber 100. Other inert gases, such as nitrogen ($N_2$) and nitric oxide (NO), may also be used to control the density and deposition rate of the amorphous carbon layer. Additionally, a variety of other processing gases may be added to the gas mixture to modify properties of the amorphous carbon material. In one implementation, the processing gases may be reactive gases, such as hydrogen ($H_2$), ammonia ($NH_3$), a mixture of hydrogen ($H_2$) and nitrogen ($N_2$), or combinations thereof. The addition of $H_2$ and/or $NH_3$ may be used to control the hydrogen ratio (e.g., carbon to hydrogen ratio) of the deposited amorphous carbon layer. The hydrogen ratio present in the amorphous carbon film provides control over layer properties, such as reflectivity.

At operation 230, a boron-containing gas mixture is flowed into the processing volume 126. The boron-containing gas mixture may be flowed from the gas panel 130 into the processing volume 126 through the showerhead 120. In one implementation, the boron-containing gas mixture comprises a boron-containing compound and an inert gas. Examples of boron-containing compounds include diborane ($B_2H_6$), trimethylborane (TMB or $B(CH_3)_3$), triethylborane (TEB), methylborane, dimethylborane, ethylborane, diethylborane, and similar compounds.

In one implementation, the percentage of boron-containing compound in the total boron-containing gas mixture is from about 2% to about 20%. In another implementation, the percentage of boron-containing compound in the total boron-containing gas mixture is from about 5% to about 10%. Exemplary boron-containing gas mixtures may include 5% $B_2H_6$/95% $N_2$, 5% $B_2H_6$/95% He, 10% $B_2H_6$/90% He, 5% $B_2H_6$/95% Ar, 10% $B_2H_6$/90% Ar, or 5% $B_2H_6$/95% $H_2$. It is contemplated that when different concentrations of boron-containing gas mixtures are used, the flow rate to achieve certain film properties may change accordingly. For example in implementations where 5% diborane is used as the boron-containing gas source, the flow rate of the boron-containing gas mixture may be from about 5,000 sccm to about 15,000 sccm, for example, about 13,000 sccm. In another implementation where 10% diborane is used as the boron-containing gas source, the flow rate of the boron-containing gas mixture may be from about 4,000 sccm to about 10,000 sccm, for example about 6,000 sccm to about 7,000 sccm.

FIGS. 2A-2B depict one implementation where the hydrocarbon-containing gas mixture and the boron-containing gas mixture are introduced into the processing volume 126 before turning on the RF plasma in operation 250. In such an implementation, the hydrocarbon-containing gas mixture may be introduced into the processing volume 126 for a longer time such as between about 5 seconds and about 30 seconds, for example about 15 seconds, which may vary depending upon the size of the substrate. The flowing of the hydrocarbon-containing gas mixture prior to the introduction of the boron-containing gas is believed to provide continuous thermal and pressure stabilization of the processing volume 126. While flowing the hydrocarbon-containing gas mixture, the boron-containing gas mixture is then flowing into the processing volume 126 about 0.5 seconds to about 5 seconds, for example about 1 second to about 2 seconds (the flowing time may vary as long as the flow is just long enough for the boron-containing gas mixture to start reaching the processing volume 126) prior to striking the RF plasma in operation 250. The process of operation 230 may be performed simultaneously, sequentially or partially overlap with the processes of operation 220.

Figure 4:
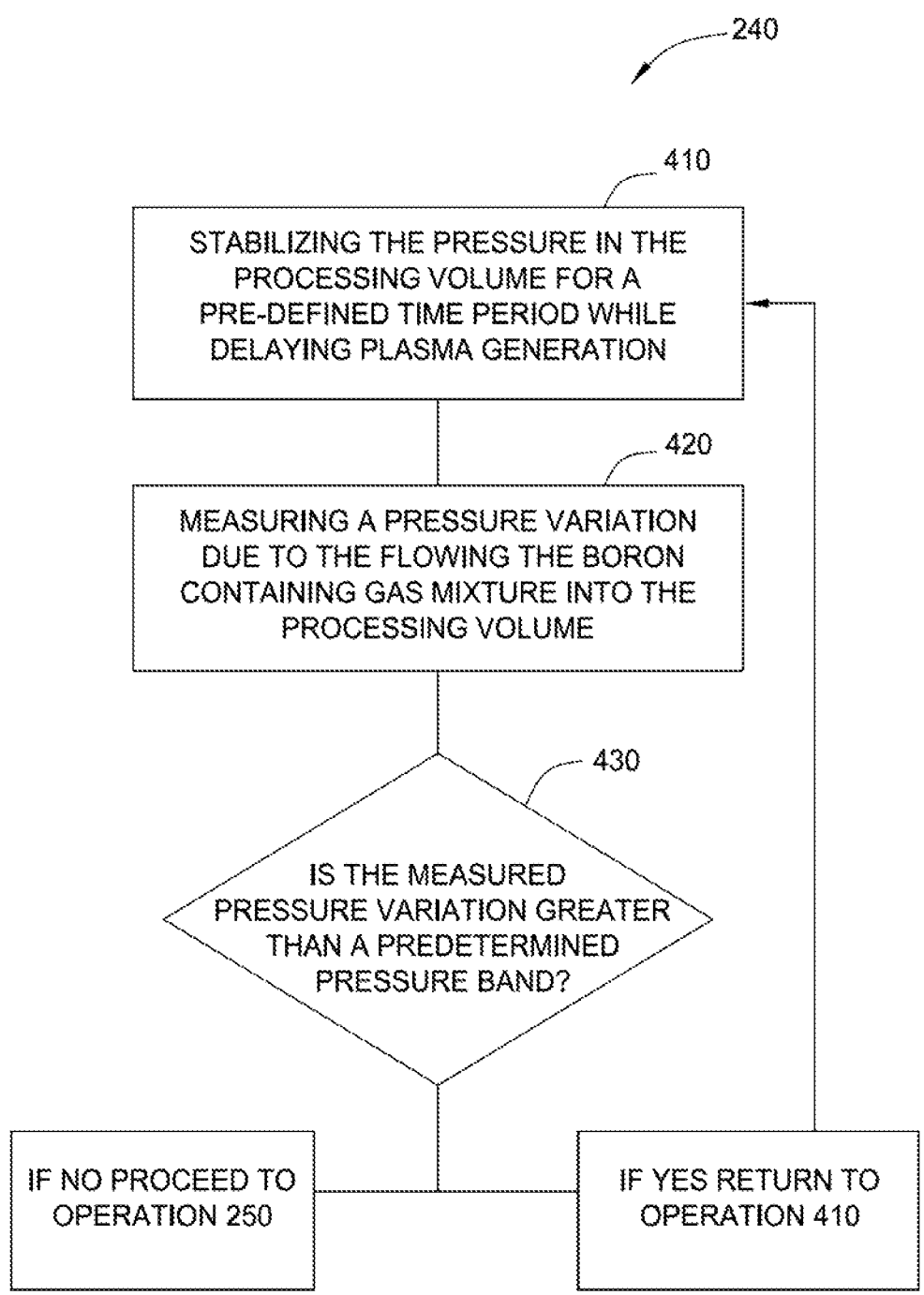
FIG. 4 depicts a process flow diagram depicting one implementation of a method for stabilizing chamber pressure according to implementations described herein.

At operation 240, the pressure in the processing volume is stabilized for a predefined RF-on delay time period as shown in FIG. 4. The predefined RF-on delay time period is a fixed time delay defined as the time period between introduction of the boron-containing gas mixture into the processing volume and striking or generating the plasma in operation 250. Any suitable fixed time delay may be used. The length of the RF-on delay time period is typically selected such that the boron-containing gas mixture does not begin to thermally decompose or substantially thermally decompose in the processing volume. The process of operation 240 may be performed simultaneously, sequentially or partially overlap with the processes of operation 220 and operation 230.

At operation 250, after the predefined RF-on delay time period of operation 240, RF plasma is generated in the processing volume 126 to deposit a boron-containing amorphous carbon film 304 on the substrate 190. The plasma may be formed by capacitive or inductive means, and may be energized by coupling RF power into the precursor gas mixture. The RF power may be a dual-frequency RF power that has a high frequency component and a low frequency component. The RF power is typically applied at a power level between about 50 W and about 1,500 W, which may be all high-frequency RF power, for example at a frequency of about 13.56 MHz, or may be a mixture of high-frequency power and low frequency power, for example at a frequency of about 300 kHz. The flow of hydrocarbon-containing gas mixture and the boron-containing gas mixture may continue until a desired thickness of the boron-containing amorphous carbon film 304 is reached.

The thickness of the boron-containing amorphous carbon film 304 is variable depending upon the stage of processing. In one implementation, the boron-containing amorphous carbon film 304 may have a thickness from about 100 Å to about 20,000 Å (e.g., from about 300 Å to about 5,000 Å; from about 1,000 Å to about 2,000 Å). The boron-containing amorphous carbon film 304 may be patterned using a standard photoresist patterning techniques. The boron-containing amorphous carbon film 304 may be removed using a solution comprising hydrogen peroxide and sulfuric acid. One exemplary solution comprising hydrogen peroxide and sulfuric acid is known as Piranha solution or Piranha etch. The boron-containing amorphous carbon film 304 may also be removed using etch chemistries containing oxygen and halogens (e.g. fluorine or chlorine), for example, $Cl_2/O_2$, $CF_4/O_2$, $Cl_2/O_2/CF_4$.

At operation 260, an optional purging/evacuation process of the processing volume of the processing chamber may be performed to remove any excess processing gases, by-products, or both from the deposition process. In some implementations, plasma may be applied during the optional purge/evacuation process of operation 260.

At operation 270, the processing volume of the process chamber is exposed to a plasma cleaning process. The chamber clean process may be performed by introducing fluorine-containing gases and oxidizing gases into the processing volume 126 either as a process gas mixture or separately. Any suitable fluorine-containing gas may be used. Exemplary fluorine-containing gases include $NF_3$. Any suitable oxidizing gas may be used. Exemplary oxidizing gases that may be used include oxygen ($O_2$), ozone ($O_3$), nitrous oxide ($N_2O$), carbon monoxide (CO), carbon dioxide ($CO_2$), water ($H_2O$), 2,3-butanedione, or combinations thereof. In one implementation, the chamber clean process is performed by introducing $NF_3$ and $O_2$ into the processing volume 126, and striking a plasma in the processing volume 126 according to methods known in the art to remove material deposited on the chamber walls and chamber components from the previous deposition process.

In another implementation, the plasma may be formed by a remote plasma source (RPS) and delivered to the processing chamber. The plasma may be formed by coupling RF power to a treatment gas such as He, Ar, $O_2$, $N_2$, or combinations thereof. In some implementations where the plasma is formed in a remote plasma source (RPS) the power application may be from about 1,000 Watts to about 15,000 Watts (e.g., from about 8,000 Watts to about 22,000 Watts; from about 9,000 Watts to about 10,000 Watts) with a treatment gas (e.g., argon) flow rate from about 500 sccm to about 6,000 sccm (e.g., from about 1,000 sccm to about 2,000 sccm).

The oxidizing gas may be introduced into the chamber at a flow rate of between about 3,000 sccm and about 10,000 sccm (e.g., between about 4,000 sccm and about 6,000 sccm; between about 4,500 sccm and about 5,000 sccm). The fluorine-containing gas may be introduced into the chamber at a flow rate of between about 100 sccm and about 1,000 sccm (between about 400 sccm and about 700 sccm; between about 550 sccm and about 600 sccm). In one implementation, the oxidizing gas may be introduced into the chamber at a flow rate of about 5,000 sccm and the nitration gas may be introduced into the chamber at a flow rate of about 550 sccm.

Optionally, one or more carrier gases may be included with the gases used to perform the plasma cleaning process. Exemplary carrier gases that may be used include argon, helium, and combinations thereof.

At operation 280, an optional purging/evacuation process of the processing volume of the process chamber may be performed to remove the gaseous reaction products formed between the cleaning gases and the deposition material and contaminants present within the chamber. In some implementations, plasma may be applied during the optional purge/evacuation process of operation 280.

Figure 7:
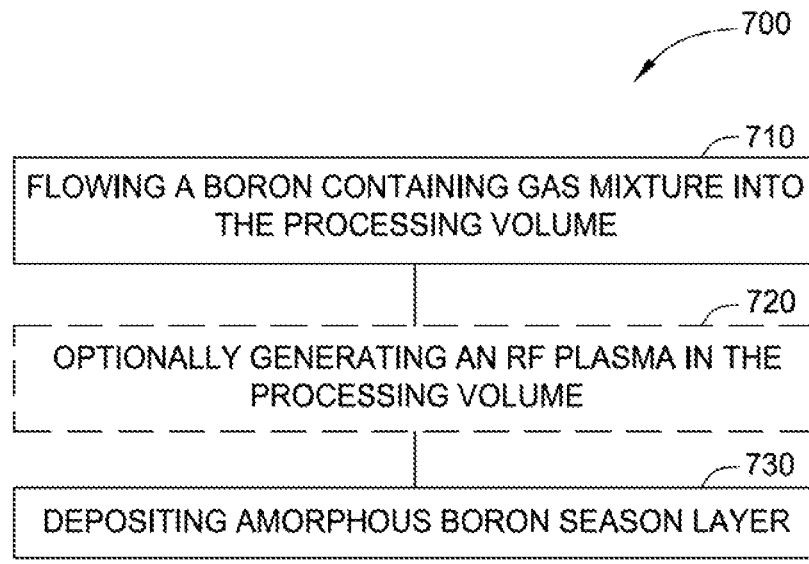
FIG. 7 depicts a process flow diagram depicting one implementation of a method for depositing a season layer according to implementations described herein.

At operation 290, a season layer is deposited over at least one surface of the processing volume of the process chamber according to method 700 as shown in FIG. 7. The season layer is an amorphous boron-containing layer. The season layer may be deposited on the interior surfaces of the chamber including, for example, chamber components such as the faceplate of the showerhead.

After the process of operation 290, an optional purge process may be performed to remove any remaining processing gases from the process chamber. Additional substrates may be processed in the processing volume of the process chamber after deposition of the season layer.

FIG. 4 depicts a process flow diagram depicting one implementation of operation 240 for stabilizing chamber pressure according to implementations described herein. At operation 410, the chamber pressure is stabilized for a fixed time delay. The fixed time delay is a pre-defined time period. Any suitable fixed time delay may be used. The fixed time delay is typically selected such that the boron-containing gas mixture does not begin to thermally decompose or substantially thermally decompose in the processing volume. The time period for the fixed time delay may be determined in a feedback type process where the time period for the boron-containing gas mixture to thermally decompose or substantially thermally decompose is determined. In one implementation, the fixed time delay is between about 0.1 seconds and about 5 seconds (e.g., between about 0.5 seconds and 3 seconds; between about 1 second and 1.5 seconds).

At operation 420, a pressure variation due to the flowing the boron-containing gas mixture into the processing volume is measured. The pressure variation may be determined by comparing the pressure in the processing volume prior to introduction of the boron-containing gas mixture with the pressure in the processing volume after introduction of the boron-containing gas mixture. The pressure may be monitored using pressure sensors positioned in the fluid flow lines, the processing volume, or both. Pressure may be monitored with a pressure manometer mounted underneath the processing chamber.

At operation 430, the measured pressure variation is compared to a predetermined pressure band. If the measured pressure variation is less than or falls within the predetermined pressure band, then after the pre-defined time period ends, the process proceeds to operation 250 after the pre-defined time delay where the plasma is generated. If the measured pressure variation is greater than the predetermined pressure band, then the process either returns to operation 410 where the chamber pressure is stabilized for a pre-defined time period or the process ends.

The pressure band is the pressure tolerance that allows the maximum of pressure variation when gas flow is introduced to the chamber. For example, when the boron-containing gas mixture is flowed into the processing volume, the pressure within the processing volume will be changed because the throttle valve opening has not yet changed. Eventually, the throttle valve opening will adjust to match the pressure setting. The pressure band is set so that the real pressure variation will be less than the pressure band. If the pressure variation is beyond the pressure band, the recipe will fault out and stop. If the pressure variation is greater than the pressure band there may be something wrong with either the flow or the throttle valve. Further, striking plasma with a pressure variation greater than the pressure band could lead to arcing.

The pressure band may be determined through a series of tests by flowing a different volume of gas flow into the processing volume. In one implementation, the pressure band is from about 0.1 mTorr to about 1 Torr (e.g., from about 1 mTorr to about 0.5 Torr; from about 0.05 Torr to 0.5 Torr; from about 1 mTorr to 2 mTorr). In one implementation, the pressure variation is less than about 0.5 Torr.

Figure 5A:
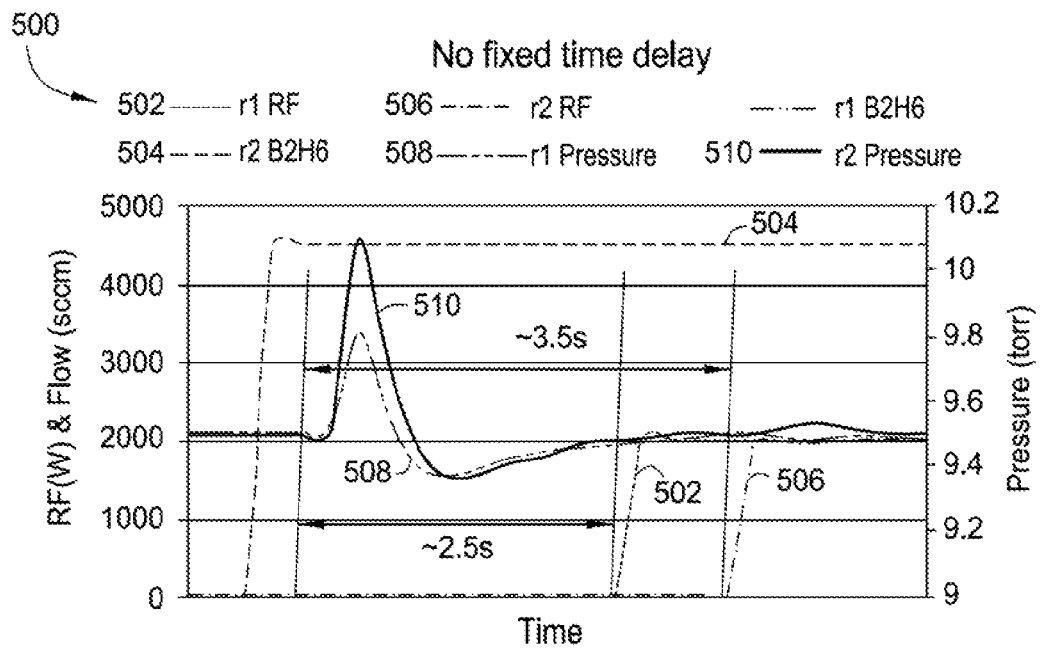
FIG. 5A depicts a timing diagram for a prior art deposition process performed without a fixed time delay.

FIG. 5A depicts a timing diagram 500 for a prior art deposition process performed without a fixed time delay between the flow of boron-containing gas mixture entering the processing volume and the RF on process. The timing diagram 500 charts RF power (r1 RF 502; r2 RF 506), boron precursor flow (r2 $B_2H_6$ 504) and pressure (r1 pressure 508; r2 pressure 510). Herein, r1 represents a first run and r2 represents a second run. As depicted in FIG. 5A, if the boron-containing gas mixture flows directly into the chamber, the RF plasma will not turn on until the chamber pressure becomes stable. In this case, there is a time delay between the boron-containing gas mixture flowing to the processing volume and the plasma-on process and the time delay is variable for each run of process, which causes non-repeatability issues for the process.

Figure 5B:
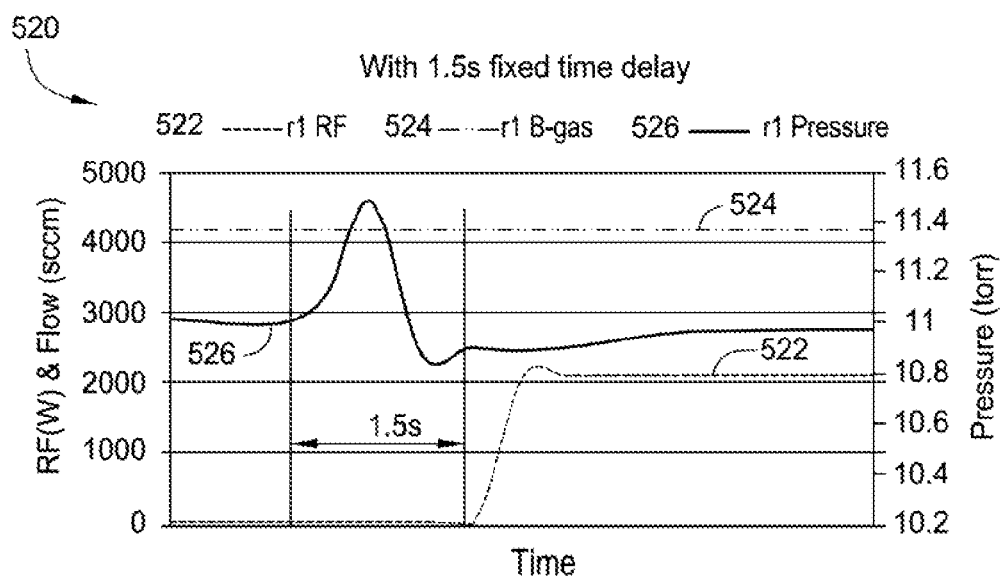
FIGS. 5B and 5C depict timing diagrams for a stabilization process performed with a fixed time delay according to implementations described herein.
Figure 5C:
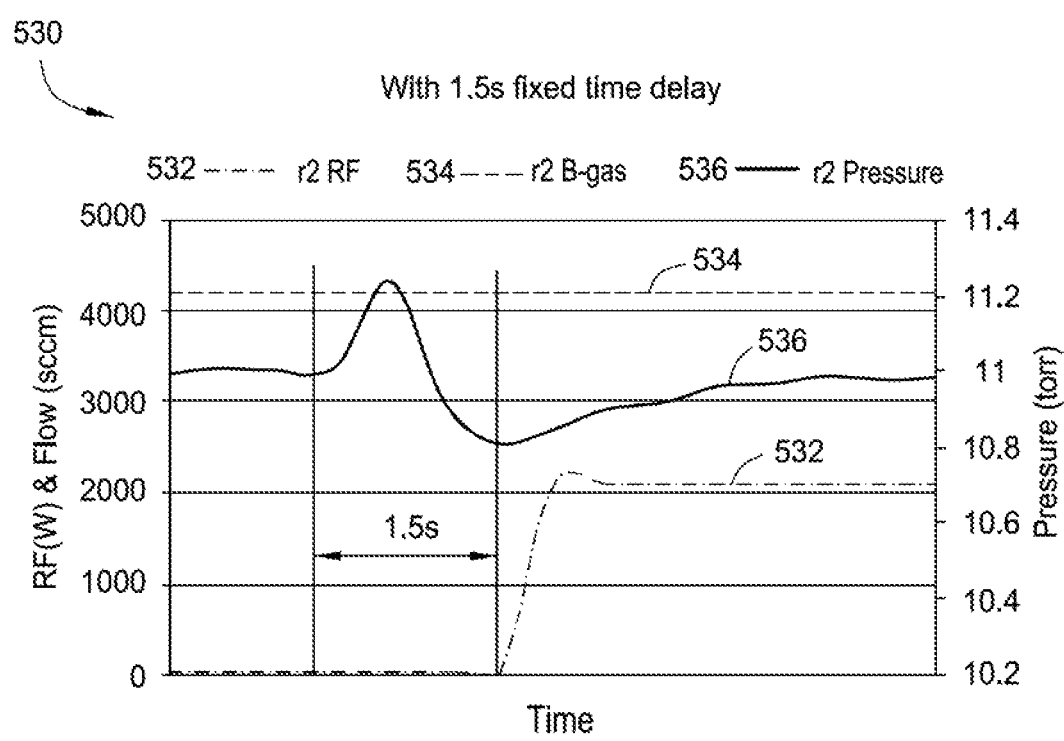

FIGS. 5B and 5C depict a timing diagram 520, 530 for a stabilization process performed with a fixed time delay according to implementations described herein. In the implementations depicted in FIGS. 5B and 5C, a fixed time delay, e.g. 0.1-5 seconds, is applied, and a pressure band, e.g. 0.05-0.5 Torr, is established. If the pressure variation due to the injection of boron-containing precursor gas is less than the pressure band in the fixed delay time, the RF plasma will be turned on and "real" deposition will start. Thus, the goals of good repeatability of the process and good in-film particle performance are achieved. Timing diagram 520 charts RF power (r1 RF 522), boron precursor flow (r1 B-gas 524) and pressure (r1 Pressure 526) for a first run r1. Timing diagram 530 charts RF power (r2 RF 532), boron precursor flow (r2 B-gas 534) and pressure (r2 Pressure 536) for a second run r2.

Figure 6:
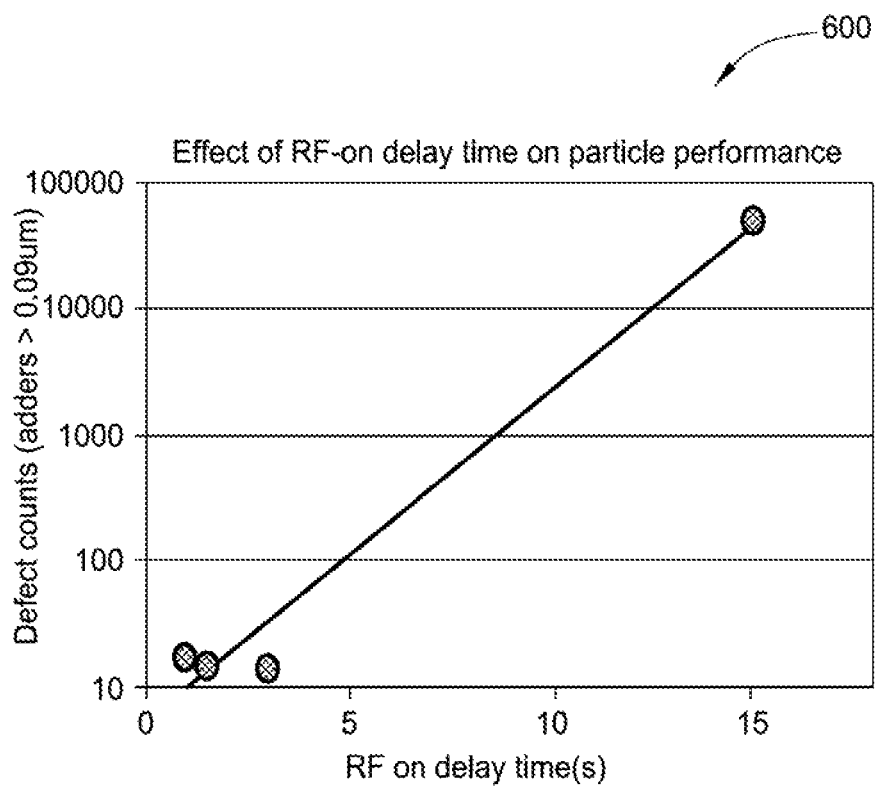
FIG. 6 depicts a plot of the effect of RF-on delay time on particle performance for a boron amorphous carbon film deposited according to implementations described herein.

FIG. 6 depicts a plot 600 of the effect of RF-on delay time on particle performance for a boron-containing amorphous carbon film deposited according to implementations described herein. As depicted in FIG. 6, the amount of defects increases when the RF-on delay time is out of the optimum delay-time window.

FIG. 7 depicts a process flow diagram depicting one implementation of a method 700 for depositing a season layer according to implementations described herein. In preparation for deposition of the season layer, the chamber may be purged/evacuated (operation 280). In one implementation, the distance between the pedestal and showerhead may be set to about 350 mils and the chamber may be maintained at a temperature from the previous process or heated to a temperature of about 550 degrees Celsius. At operation 710, a process gas that includes a boron-containing gas mixture is introduced into the processing volume 126 of the processing chamber. In one implementation, the boron-containing gas mixture comprises a boron-containing compound and an optional carrier gas. Examples of boron-containing compounds include diborane ($B_2H_6$), trimethylboron (TMB or $B(CH_3)_3$), triethylborane (TEB), methylborane, dimethylborane, ethylborane, diethylborane, and similar compounds. Exemplary carrier gases that may be used include argon, helium, nitrogen, hydrogen, or combinations thereof.

In one implementation, the percentage of boron-containing compound in the total boron-containing gas mixture is from about 2% to about 20%. In another implementation, the percentage of boron-containing compound in the total boron-containing gas mixture is from about 5% to about 10%. Exemplary boron-containing gas mixtures may include 5% $B_2H_6$/95% $N_2$, 5% $B_2H_6$/95% He, 10% $B_2H_6$/90% He, 5% $B_2H_6$/95% Ar, 10% $B_2H_6$/90% Ar, or 5% $B_2H_6$/95% $H_2$.

In certain implementations where 5% diborane is used as the boron-containing gas source, the flow rate of the boron-containing gas mixture may be from about 1,000 sccm to about 5,000 sccm, for example, about 2,000 sccm to about 3,000 sccm. In one another implementation where 10% diborane is used as the boron-containing gas source, the flow rate of the boron-containing gas mixture may be from about 500 sccm to about 3,000 sccm, for example, from about 1,000 sccm to about 2,000 sccm.

In one implementation, the amorphous boron season layer is deposited by a thermal decomposition process. The thermal decomposition process is a plasma-free process. The boron-containing gas mixture may continue to flow until a desired thickness of the amorphous boron season layer is reached.

In implementations where the deposition process is a PECVD process, at operation 720, after the deposition conditions are stabilized, a plasma is generated in the processing volume 126 to deposit an amorphous boron season layer on the substrate 190. The plasma may be formed from mixed frequency RF power in which a high frequency RF component of 13.56 MHZ is powered at a power from about 300 Watts to about 1,500 Watts (e.g., from about 500 Watts to about 1,000 Watts, from about 1,000 Watts to about 1,200 Watts) and a low frequency RF component of 350 KHz is powered at a power from about 100 Watts to about 1,000 Watts (e.g., from about 300 Watts to about 500 Watts; about 330 Watts to about 350 Watts) For most applications, the plasma is maintained for about 5 to 60 seconds to deposit a season layer of between about 500 Å to about 6,000 Å.

At operation 730, an amorphous boron season layer is deposited. The length of the first season process depends in part on the amount of residue left in the chamber, which is in part dependent on the length of the clean and deposition processes.

In any of the implementations described herein, during deposition of the season layer the chamber, the wafer, or both may be maintained at a temperature between 100 degrees Celsius to about 700 degrees Celsius (e.g., between about 200 degrees Celsius to about 500 degrees Celsius; between about 300 degrees Celsius to about 400 degrees Celsius). The chamber pressure may range from a chamber pressure of about 1 Torr to about 20 Torr (e.g., between about 2 Torr and about 10 Torr; between about 5 Torr and about 6 Torr). The distance between the pedestal and showerhead is set to between about 300 to about 1100 mils.

The season layer may be deposited to have a thickness between about 100 Å and about 2,000 Å (e.g., between about 300 Å and about 1,500 Å; between about 500 Å to about 1,000 Å).

Any excess process gases and by-products from the deposition of the season layer may then be removed from the chamber by performing an optional purge/evacuation process.

Figure 8:
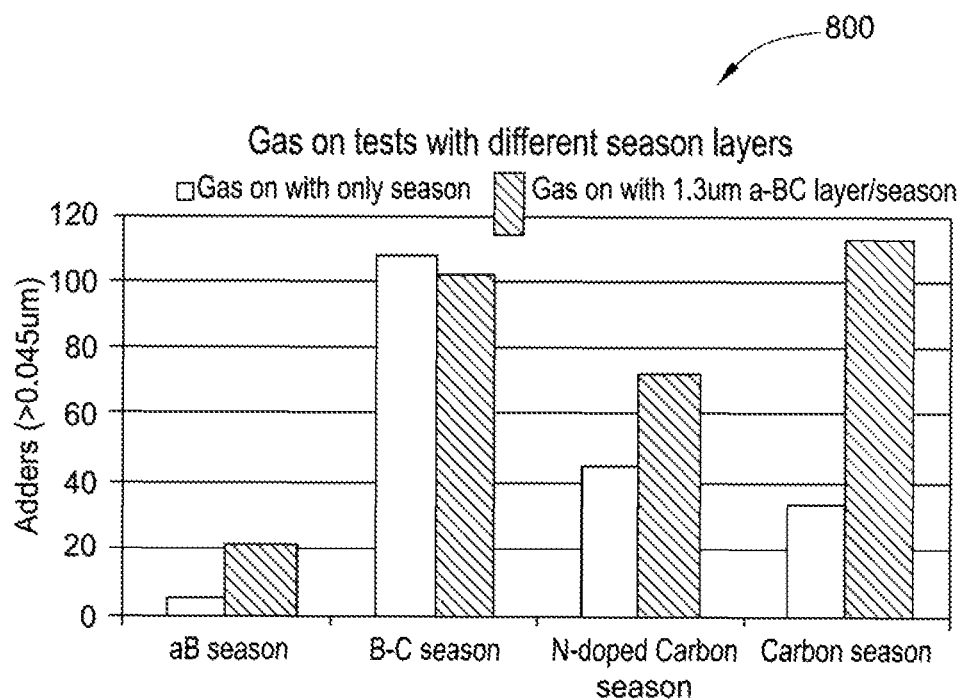
FIG. 8 is a plot depicting gas-on particle adders for a season layer deposited according to implementations described herein in comparison with season layers deposited using prior art techniques.

FIG. 8 is a plot 800 depicting gas-on particle adders (>0.045 µm, with flowing process gas without plasma-on, which is called gas-on particles) for a season layer deposited according to implementations described herein in comparison with season layers deposited using prior art techniques. Plot 800 shows a comparison between a carbon season layer, a nitrogen-doped carbon season layer, a boron-carbon amorphous carbon layer and an amorphous boron season layer formed according to implementations described herein. The plot 800 further differentiates between gas-on with only season and gas-on with a 1.3 µm boron-containing amorphous carbon layer is deposited according to implementations described herein in combination with the amorphous boron season layer. As depicted in plot 800, the amorphous boron season yielded the best defect counts (<30 adders for particle size>0.045 µm).

Figure 9:
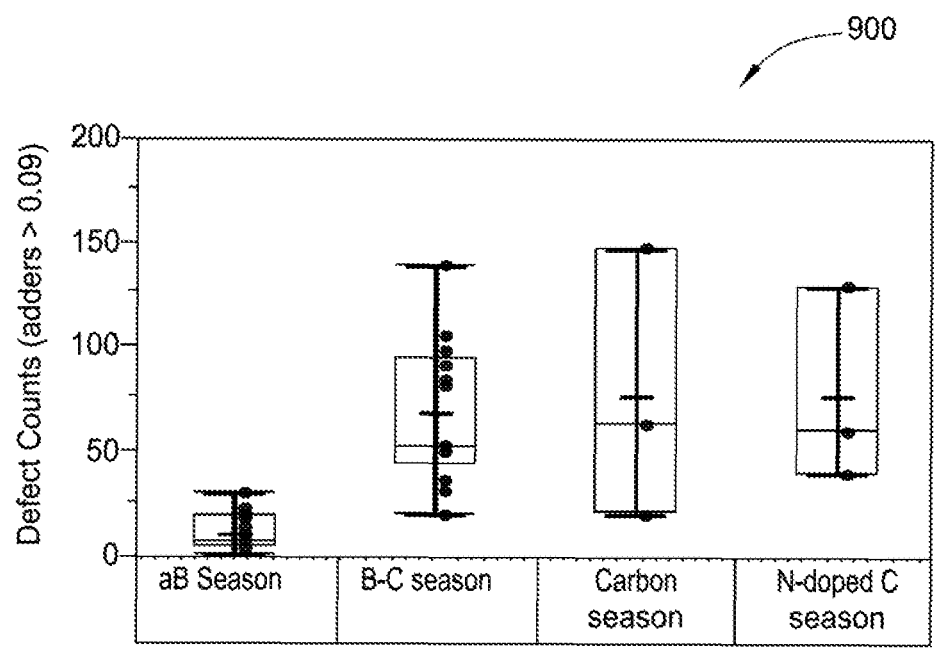
FIG. 9 is a plot depicting particle adders for a season layer deposited according to implementations described herein in comparison with season layers deposited using prior art techniques.

FIG. 9 is a plot 900 depicting the defect counts (adders>0.09 µm) for a season layer deposited according to implementations described herein in comparison with season layers deposited using prior art techniques. Plot 900 shows a comparison between a carbon season layer, a nitrogen-doped carbon season layer, a boron-carbon amorphous carbon layer and an amorphous boron season layer formed according to implementations described herein. As depicted in plot 900, the amorphous boron season layer leads to less in-film particles (<30 adders for particle size>0.09 µm).

Figure 10:
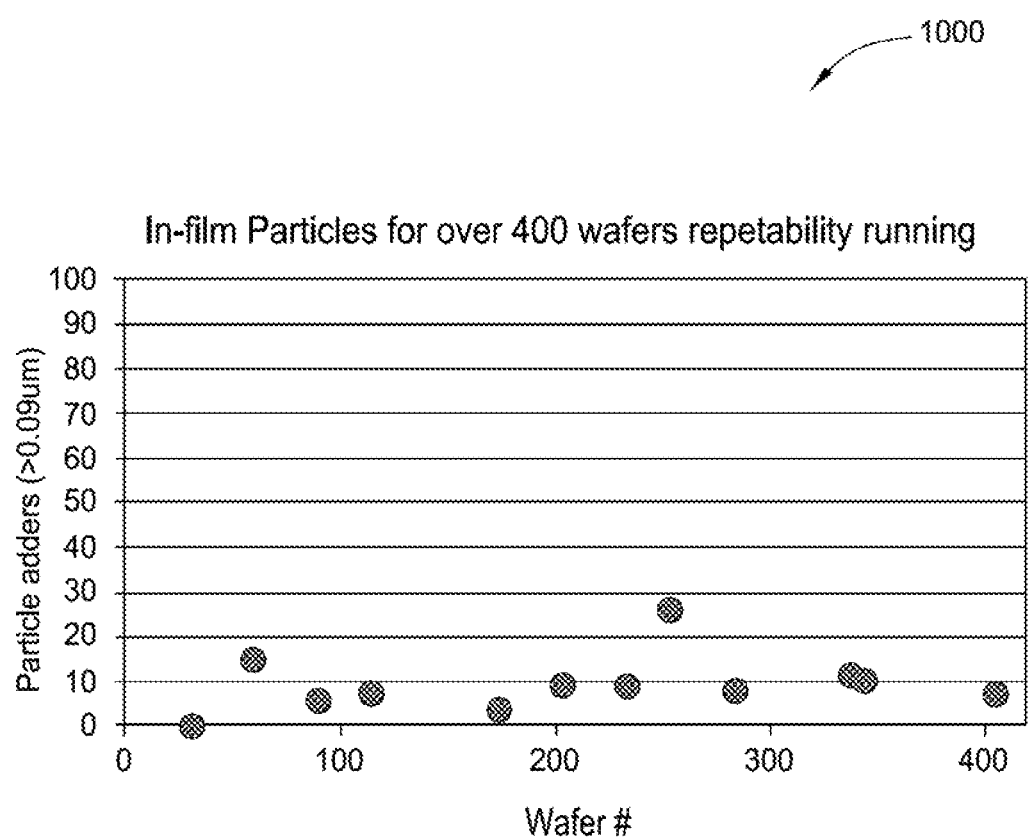
FIG. 10 is a plot depicting in-film particle performance of boron-containing amorphous carbon film deposition process with amorphous boron season layer and RF-on delay time according to implementations described herein.

FIG. 10 is a plot 1000 depicting in-film particle performance of amorphous boron-carbon film deposition process with amorphous boron season layer and RF-on delay time according to implementations described herein. As depicted in FIG. 10, the combined fixed RF-on delay time period and amorphous boron season layer provide boron-containing amorphous carbon films with good in-film particle performance with repeated wafers running.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method, comprising:
   flowing a hydrocarbon-containing gas mixture into a processing volume having a substrate positioned therein;
   flowing a boron-containing gas mixture into the processing volume;
   stabilizing a pressure in the processing volume for a predefined RF-on delay time period;
   generating an RF plasma in the processing volume after the predefined RF-on delay time period expires to deposit a boron-containing amorphous film on the substrate;
   exposing the processing volume to a dry cleaning process; and
   depositing an amorphous boron season layer over at least one surface in the processing volume.

2. The method of claim 1, wherein the predefined RF-on delay time period is a fixed time delay defined as the time period between flowing the boron-containing gas mixture into the processing volume and generating the RF plasma.

3. The method of claim 2, wherein a length of the predefined RF-on delay time period is selected so that the boron-containing gas mixture does not begin to thermally decompose or substantially thermally decompose in the processing volume.

4. The method of claim 1, wherein flowing the hydrocarbon-containing gas mixture into the processing volume having the substrate positioned therein, flowing the boron-containing gas mixture into the processing volume, and stabilizing the pressure in the processing volume for the predefined RF-on delay time period at least partially overlap.

5. The method of claim 1, wherein the predefined RF-on delay time period is between about 0.1 seconds and 5 seconds.

6. The method of claim 1, wherein stabilizing the pressure in the processing volume for the predefined RF-on delay time period further comprises:
measuring a pressure variation in the processing volume caused by the flowing the boron-containing gas mixture into the processing volume;
comparing the pressure variation to a predetermined pressure band; and
generating the RF plasma in the processing volume after the predefined RF-on delay time period expires if the pressure variation is less than or falls within the predetermined pressure band.

7. The method of claim 6, wherein the predetermined pressure band is from about 0.05 Torr to about 0.5 Torr.

8. The method of claim 1, wherein the dry cleaning process comprises:
delivering a fluorine-containing gas, an oxidizing gas, or mixture thereof into the processing volume;
forming a plasma via a remote plasma source; and
delivering the plasma to the processing volume.

9. The method of claim 1, wherein depositing the amorphous boron season layer comprises:
flowing a second boron-containing gas mixture into the processing volume; and
thermally decomposing the second boron-containing gas mixture to deposit the amorphous boron season layer over the at least one surface in the processing volume.

10. The method of claim 9, wherein the amorphous boron season layer has a thickness between about 300 Å and about 1,500 Å.

11. A method, comprising:
flowing a hydrocarbon-containing gas mixture into a processing volume having a substrate positioned therein;
flowing a boron-containing gas mixture into the processing volume;
stabilizing a pressure in the processing volume for a predefined RF-on delay time period; and
generating an RF plasma in the processing volume after the predefined RF-on delay time period expires to deposit a boron-containing amorphous film on the substrate.

12. The method of claim 11, wherein the predefined RF-on delay time period is a fixed time delay defined as the time period between flowing the boron-containing gas mixture into the processing volume and generating the RF plasma.

13. The method of claim 12, wherein a length of the predefined RF-on delay time period is selected so that the boron-containing gas mixture does not begin to thermally decompose or substantially thermally decompose in the processing volume.

14. The method of claim 11, wherein flowing the hydrocarbon-containing gas mixture into the processing volume having the substrate positioned therein, flowing the boron-containing gas mixture into the processing volume, and stabilizing the pressure in the processing volume for the predefined RF-on delay time period at least partially overlap.

15. The method of claim 11, wherein the predefined RF-on delay time period is between about 0.1 seconds and about 5 seconds.

16. The method of claim 11, wherein stabilizing the pressure in the processing volume for the predefined RF-on delay time period further comprises:
measuring a pressure variation in the processing volume caused by the flowing the boron-containing gas mixture into the processing volume;
comparing the pressure variation to a predetermined pressure band; and
generating the RF plasma in the processing volume after the predefined RF-on delay time period expires if the pressure variation is less than or falls within the predetermined pressure band.

17. The method of claim 16, wherein the predetermined pressure band is from about 0.05 Torr to about 0.5 Torr.

18. A method, comprising:
flowing a hydrocarbon-containing gas mixture into a processing volume having a substrate positioned therein, wherein the hydrocarbon-containing gas mixture comprises propene ($C_3H_6$);
flowing a boron-containing gas mixture into the processing volume, wherein the boron-containing gas mixture comprises diborane ($B_2H_6$) and at least one of nitrogen ($N_2$), helium, argon, and hydrogen ($H_2$);
stabilizing a pressure in the processing volume for a predefined RF-on delay time period, comprising:
measuring a pressure variation in the processing volume caused by the flowing the boron-containing gas mixture into the processing volume; and
comparing the pressure variation to a predetermined pressure band; and
generating an RF plasma in the processing volume after the predefined RF-on delay time period expires if the pressure variation is less than or falls within the predetermined pressure band to deposit a boron-containing amorphous film on the substrate, wherein the predefined RF-on delay time period is a fixed time delay defined as the time period between flowing the boron-containing gas mixture into the processing volume and generating the RF plasma.

19. The method of claim 18, wherein the predefined RF-on delay time period is between about 0.1 seconds and about 5 seconds.

20. The method of claim 19, wherein the predetermined pressure band is from about 0.05 Torr to about 0.5 Torr.

* * * * *